US012751191B2

(12) United States Patent
Shin et al.

(10) Patent No.: US 12,751,191 B2
(45) Date of Patent: Sep. 29, 2026

(54) DISPLAY DEVICE INCLUDING REFLECTION CONTROL LAYER

(71) Applicant: SAMSUNG DISPLAY CO., LTD., Yongin-si (KR)

(72) Inventors: Hyebeom Shin, Yongin-si (KR); Daewon Kim, Yongin-si (KR); Su Jeong Kim, Yongin-si (KR); Jongho Son, Yongin-si (KR); Kyunghee Lee, Yongin-si (KR); Jinhyeong Lee, Yongin-si (KR); Sun-Young Chang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 497 days.

(21) Appl. No.: 18/310,051

(22) Filed: May 1, 2023

(65) Prior Publication Data

US 2024/0130207 A1 Apr. 18, 2024

(30) Foreign Application Priority Data

Sep. 26, 2022 (KR) ........................ 10-2022-0121712

(51) Int. Cl.
*H10K 59/80* (2023.01)
*H10K 59/122* (2023.01)
(Continued)

(52) U.S. Cl.
CPC ....... *H10K 59/8792* (2023.02); *H10K 59/122* (2023.02); *H10K 59/871* (2023.02);
(Continued)

(58) Field of Classification Search
CPC ...... H10K 50/865; H10K 50/81; H10K 50/82; H10K 50/8426; H10K 59/8792;
(Continued)

(56) References Cited

U.S. PATENT DOCUMENTS 11,231,616 B2 * 1/2022 Kim .................. G02F 1/133606
2006/0158095 A1 * 7/2006 Imamura ............ H10K 59/1315
313/506

(Continued)

FOREIGN PATENT DOCUMENTS

KR 10-1021450 3/2011
KR 10-1076262 10/2011

(Continued)

OTHER PUBLICATIONS

Nakajima, Y., et al., "Hydrosilylation reaction of olefins: recent advances and perspectives", in RSC Adv., 5, Feb. 12, 2015, pp. 20603-20616.

(Continued)

*Primary Examiner* — Ida M Soward
(74) *Attorney, Agent, or Firm* — F. CHAU & ASSOCIATES, LLC

(57) ABSTRACT

A display device includes a display panel, a filler layer, a reflection control layer, a plurality of light-blocking patterns, and an encapsulation substrate. The low reflection layer is disposed on the display panel. The filler layer is disposed on the display panel. The reflection control layer includes a first catalyst and is disposed on the filler layer. The plurality of light-blocking patterns is disposed between the filler layer and the reflection control layer. The encapsulation substrate is disposed on the reflection control layer.

19 Claims, 6 Drawing Sheets

(51) Int. Cl.
*H10K 59/12* (2023.01)
*H10K 59/126* (2023.01)

(52) U.S. Cl.
CPC ........... *H10K 59/873* (2023.02); *H10K 59/12* (2023.02); *H10K 59/126* (2023.02)

(58) Field of Classification Search
CPC .. H10K 59/122; H10K 59/871; H10K 59/873; H10K 59/126; H10K 50/12
See application file for complete search history.

(56) References Cited

U.S. PATENT DOCUMENTS

| | | | | |
|---|---|---|---|---|
| 2019/0088730 | A1* | 3/2019 | Lee | H10K 59/80522 |
| 2019/0165063 | A1* | 5/2019 | Lee | H10K 59/38 |
| 2019/0181385 | A1* | 6/2019 | Seong | H10K 59/38 |
| 2020/0365833 | A1 | 11/2020 | Joo et al. | |
| 2021/0036060 | A1* | 2/2021 | Cho | H10K 77/111 |
| 2021/0217831 | A1* | 7/2021 | Jung | H10K 59/873 |
| 2022/0057876 | A1 | 2/2022 | Song et al. | |
| 2022/0293890 | A1 | 9/2022 | Jeong et al. | |
| 2023/0090498 | A1* | 3/2023 | Kim | H10K 59/879 257/40 |

FOREIGN PATENT DOCUMENTS

| | | | | |
|---|---|---|---|---|
| KR | 20130126478 | A * | 11/2013 | H10K 59/80522 |
| KR | 10-2020-0133086 | A | 11/2020 | |
| KR | 10-2022-0022528 | A | 2/2022 | |
| KR | 10-2369369 | | 2/2022 | |
| KR | 10-2022-0129139 | A | 9/2022 | |

OTHER PUBLICATIONS

Office Action dated Jun. 24, 2026 in related Korean Patent Application No. 10-2022-0121712, 9 pages, English Translation.
Office Action dated Jun. 24, 2026 in related Korean Patent Application No. 10-2022-0121712, 7 pages, in Korean.

* cited by examiner

DISPLAY DEVICE INCLUDING REFLECTION CONTROL LAYER

CROSS-REFERENCE TO RELATED APPLICATION(S)

This application claims priority to Korean Patent Application No. 10-2022-0121712 filed on Sep. 26, 2022, in the Korean Intellectual Property Office, and the benefit accruing therefrom under 35 U.S.C. § 119, the entire contents of which are incorporated by reference herein.

TECHNICAL FIELD

The present disclosure relates to a display device. Aspects of the present disclosure relate to a display device with improved light characteristics.

DESCRIPTION OF THE RELATED ART

Various display devices may be used in multimedia devices such as televisions, mobile phones, tablet computers, navigation systems, and game consoles, etc. Some display devices are capable of being folded, bent, and/or rolled. Some display devices include a flat panel display (FPD) capable of large area, thinning, and light weight. For example, a liquid crystal display (LCD), a plasma display panel (PDP), an organic light emitting display (OLED), and the like may be used as flat panel display devices.

In some cases, OLED devices may include a plurality of metal patterns or a metal layer. OLED devices may include a polarizer to prevent reflection of external light by the metal. However, the polarizer may reduce transmittance of light emitted from an inside of the OLED device.

SUMMARY

The present disclosure describes a method of manufacturing a display device with enhanced display quality.

A display device according to an embodiment of the present disclosure may include a display panel comprising a light-emitting element, a filler layer, a reflection control layer, and an encapsulation substrate. In some cases, the light-emitting element is disposed on a base substrate. Additionally, the filler layer is disposed on the display panel and the reflection control layer including a first catalyst is disposed on the filler layer. In some cases, a plurality of light-blocking patterns is disposed between the filler layer and the reflection control layer. In some cases, and encapsulation substrate is disposed on the reflection control layer.

In some cases, the first catalyst may include at least one element selected from a group of elements comprising at least platinum, rhodium, nickel, and iron.

In some examples, a mass ratio of the first catalyst may be approximately 0.2% or greater than 0.2%.

In some cases, the reflection control layer may include tetraazaporphyrin compounds and a photo-initiator.

In some cases, each of the plurality of light-blocking patterns may include organic black and a photo-initiator.

In some cases, each of the plurality of light-blocking patterns may include a second catalyst. The second catalyst may include at least one element selected from a group of elements comprising at least platinum, rhodium, nickel, and iron.

In some cases, the second catalyst may include a same material as the first catalyst.

In some cases, the filler layer may include a third catalyst. The third catalyst may include at least one element selected from a group of elements comprising at least platinum, rhodium, nickel, and iron.

In some cases, the third catalyst may include a same material as the first catalyst.

In some cases, the light-emitting element may include a lower electrode, a pixel-defining layer covering opposite sides of the lower electrode and including a black organic material, wherein the pixel-defining layer exposes a portion of an upper surface of the lower electrode, an intermediate layer disposed on the lower electrode, and an upper electrode disposed on the intermediate layer.

In some cases, the display device may include a sealing member that seals the base substrate and the encapsulation substrate between the base substrate and the encapsulation substrate.

According to an embodiment of the present disclosure, the display device may include a display panel comprising a light-emitting element, a filler layer, a reflection control layer, and an encapsulation substrate. In some cases, the light-emitting element is disposed on a base substrate. Additionally, the filler layer is disposed on the display panel. The reflection control layer including a first catalyst is disposed on the filler layer. The encapsulation substrate is disposed on the reflection control layer. A plurality of light-blocking patterns is disposed between the reflection control layer and the encapsulation substrate.

In some cases, the first catalyst may include at least one element selected from a group of elements comprising at least platinum, rhodium, nickel, and iron.

In some examples, a mass ratio of the first catalyst may be about 0.2% or greater than 0.2%.

In some cases, the reflection control layer may include tetraazaporphyrin compounds and a photo-initiator.

In some cases, each of the plurality of light-blocking patterns may include organic black and a photo-initiator.

In some cases, each of the plurality of light-blocking patterns may include a second catalyst. The second catalyst may include at least one element selected from a group of elements comprising at least platinum, rhodium, nickel, and iron.

In some cases, the second catalyst may include a same material as the first catalyst.

In some cases, the light-emitting element may include a lower electrode, a pixel-defining layer covering opposite sides of the lower electrode and including a black organic material, wherein the pixel-defining layer exposes a portion of an upper surface of the lower electrode, an intermediate layer disposed on the lower electrode, and an upper electrode disposed on the intermediate layer.

In some cases, the display device may include a sealing member that seals the base substrate and the encapsulation substrate between the base substrate and the encapsulation substrate.

According to embodiments of the present disclosure, since the reflection control layer of the display device includes the first catalyst, the filler layer may be prevented from being uncured.

Additionally, since the plurality of light-blocking patterns of the display device includes the second catalyst, the filler layer may be prevented from being uncured.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain principles of the present disclosure. In the drawings.

DETAILED DESCRIPTION OF THE EMBODIMENTS

Figure 1:
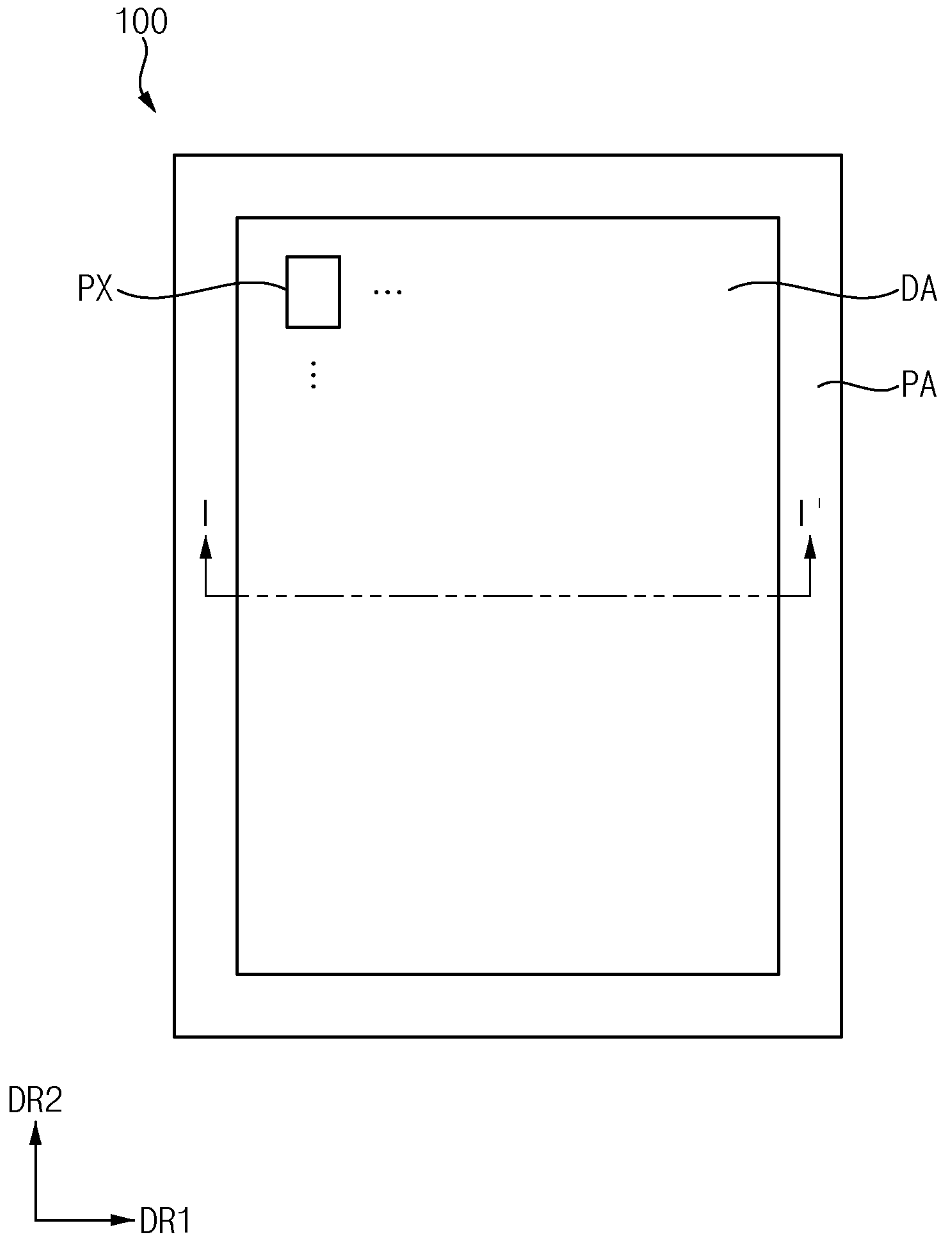
FIG. 1 is a plan view illustrating a display device according to an embodiment of the present disclosure.

Embodiments of the present disclosure describe a method to increase the display quality of a display device. The display device may include a display panel comprising a light-emitting element disposed on a base substrate, a low reflection layer disposed on the display panel, a filler layer disposed on the low reflection layer, a reflection control layer including a first catalyst and disposed on the filler layer, a plurality of light-blocking patterns disposed between the filler layer and the reflection control layer, and an encapsulation substrate disposed on the reflection control layer.

In some cases, conventional display devices do not provide a high-quality display. For example, some display devices include components for reflection control and light-blocking that interfere with the curing of a filler layer. As a result, the filler may become sufficiently not cured, it may peel, and dark spots and the like may occur in the display. Accordingly, the quality of the display is reduced.

Embodiments of the present disclosure include a display device that provides a high-quality display. An example of a display device described in the present disclosure includes a reflection control layer comprising a first catalyst and a plurality of light-blocking patterns comprising a second catalyst. Thus, un-curing of the filler layer may be mitigated or prevented and the display quality is enhanced accordingly.

The inventive concept may be modified in many alternate forms, and thus specific embodiments will be exemplified in the drawings and described in detail. In the present specification, when a component (or a region, a layer, a portion, etc.) is referred to as being "on," "connected to," or "coupled to" another component, it means that the component may be directly disposed on/connected to/coupled to the other component, or that a third component may be disposed therebetween.

Like reference numerals may refer to like components throughout the specification and the drawings. Also, in the drawings, the thickness, the ratio, and the dimensions of components are exaggerated for an effective description of technical contents. It is noted that while the drawings are intended to illustrate actual relative dimensions of a particular embodiment of the specification, the present invention is not necessarily limited to the embodiments shown. The term "and/or" includes all combinations of one or more of which associated configurations may define.

It will be understood that, although the terms "first," "second," etc. may be used herein to describe various components, these components should not necessarily be limited by these terms. These terms are only used to distinguish one component from another. For example, a first component could be termed a second component, and, similarly, a second component could be termed a first component, without departing from the scope of the inventive concept. The terms of a singular form may include plural forms unless the context clearly indicates otherwise.

In addition, terms such as "below," "under," "on," and "above" may be used to describe the relationship between components illustrated in the figures. The terms are used as a relative concept and are described with reference to the direction indicated in the drawings.

It should be understood that the terms "comprise," "include," or "have" are intended to specify the presence of stated features, integers, steps, operations, components, parts, or combinations thereof in the disclosure, but do not preclude the presence or addition of one or more other features, integers, steps, operations, components, parts, or combinations thereof.

Hereinafter, display devices in accordance with embodiments will be described in more detail with reference to the accompanying drawings. The same reference numerals are used for the same components in the drawings and redundant descriptions of the same components is omitted.

FIG. 1 is a plan view illustrating a display device according to an embodiment of the present disclosure.

In some cases, a display device DD may be a device that is activated according to an electrical signal. For example, the display device DD may be a portable electronic device, a personal digital terminal, a tablet computer, a car navigation unit, a game console, or a wearable device, but the embodiment of the inventive concept is not necessarily limited thereto.

Referring to FIG. 1, the display device 100 may include a display area DA and a peripheral area PA adjacent to the display area DA. The peripheral area PA may surround at least a portion of the display area DA. For example, the peripheral area PA may entirely surround the display area DA. The display area DA may be defined as an area capable of displaying an image by generating light or adjusting transmittance of light provided by an external light source. The peripheral area PA may be defined as an area that does not display the image.

A plurality of pixels PX may be disposed in the display area DA. In digital imaging, a pixel (or picture element) refers to the smallest addressable element in a display device, and the smallest controllable element of a picture represented on the device. In some cases, each pixel may represent a sample of an original image. The color and intensity of each pixel is variable. In color imaging systems, a color may be represented by three or four component intensities such as red, green, and blue, or cyan, magenta, yellow, and black. Each of the plurality of pixels PX may generate light according to a driving signal. Referring to FIG. 1, each of the plurality of pixels PX may be arranged along a first direction DR1 and a second direction DR2 crossing the first direction DR1.

Figure 2:
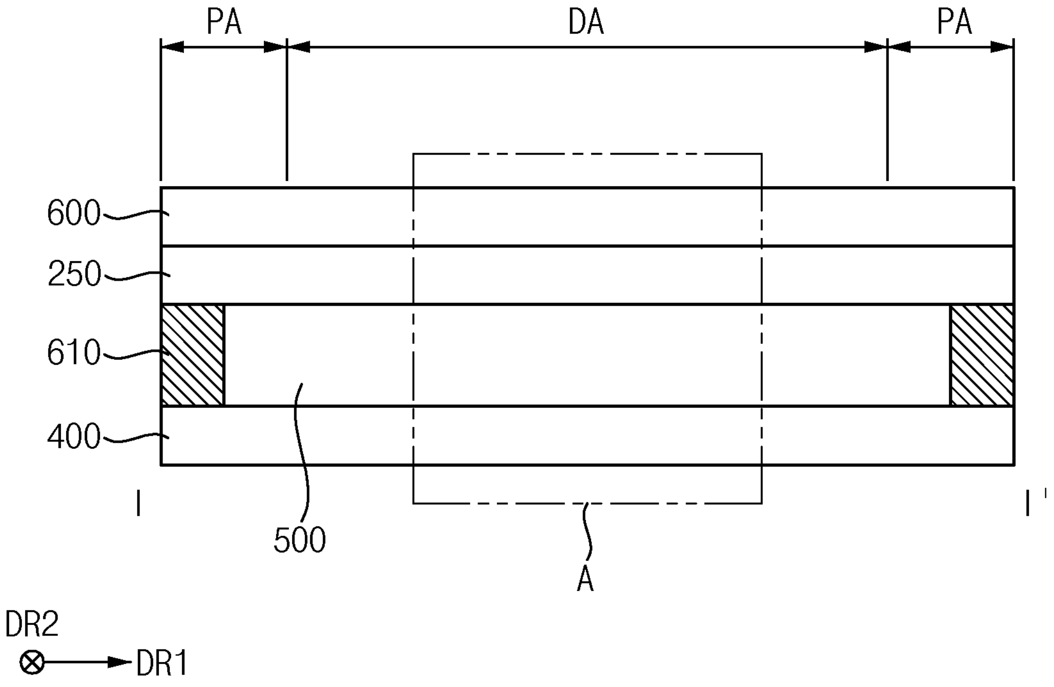
FIG. 2 is a cross-sectional view along a line I-I' of FIG. 1.
Figure 3:
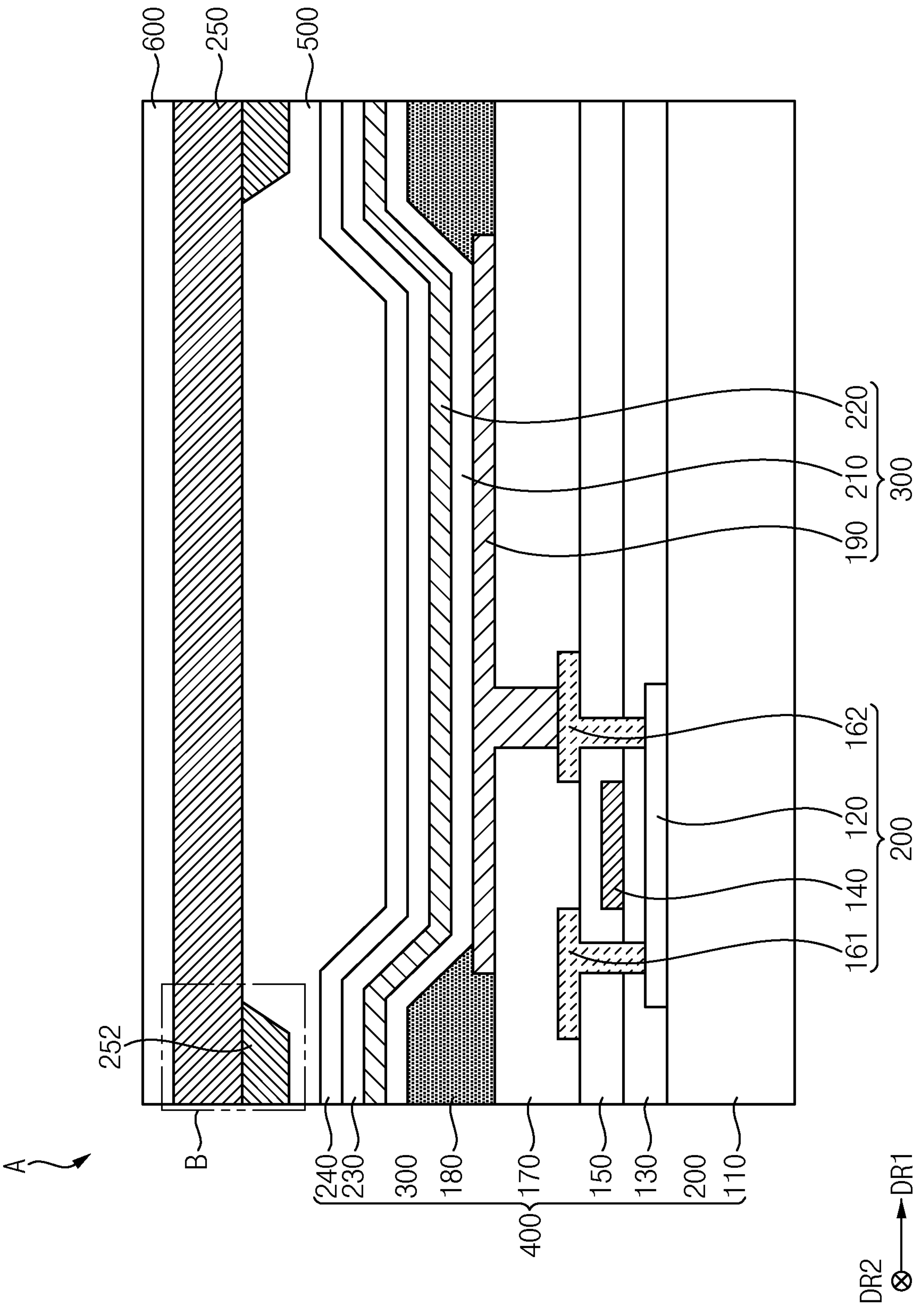
FIG. 3 is an enlarged cross-sectional view of area A of FIG. 2.

FIG. 2 is a cross-sectional view along a line I-I' of FIG. 1. FIG. 3 is an enlarged cross-sectional view of area A of FIG. 2.

Referring to FIGS. 2 and 3, the display device 100 (as described with reference to FIG. 1) may include a display panel 400, a filler layer 500, a reflection control layer 250, a plurality of light-blocking patterns 252, an encapsulation substrate 600, and a sealing member 610.

The display panel 400 may include a base substrate 110, a gate insulating layer 130, a driving element 200, an interlayer insulating layer 150, a planarization layer 170, a pixel-defining layer 180, a light-emitting element 300, a capping layer 230, and a low reflection layer 240.

The driving element 200 may include an active layer 120, a gate electrode 140, a source electrode 161, and a drain electrode 162. The light-emitting element 300 may include a lower electrode 190, an intermediate layer 210, and an upper electrode 220.

The base substrate 110 may include a transparent or opaque material. In some examples, the base substrate may include compounds such as a quartz substrate, a synthetic quartz substrate, a CaF substrate, an F-doped quartz substrate, a soda lime glass substrate, a non-alkali glass substrate, and the like. The compounds may be used alone or in combination with each other.

A buffer layer may be disposed on the base substrate 110. The buffer may prevent the diffusion of the metal atoms or impurities from base substrate 110 to the driving element 200. Additionally, when a surface of the base substrate 110 is not uniform, the buffer layer may increase a flatness of the surface of the base substrate 110. In some examples, the buffer layer may include an organic material or an inorganic material.

The active layer 120 may be disposed in the display area DA on the base substrate 110. In some examples, the active layer 120 may include a metal oxide, an inorganic semiconductor (e.g., an amorphous silicon, poly silicon), an organic semiconductor, or the like. The active layer 120 may have a source area, a drain area, and a channel area. The channel area may be positioned between the source area and the drain area.

The gate insulating layer 130 may be disposed on the base substrate 110 and the active layer 120. The gate insulating layer 130 may cover the active layer 120. The gate insulating layer 130 may include a silicon compound, a metal compound, and the like. Examples of the silicon compound that may be used for the gate insulating layer 130 may include a silicon oxide (SiOx), a silicon nitride (SiNx), a silicon carbide (SiCx), a silicon oxynitride (SiOxNy), a silicon oxycarbide (SiOxCy), and the like. Additionally, examples of the metal compound that may be used for the gate insulating layer 130 may include an aluminum oxide (AlO), an aluminum nitride (AlN), a tantalum oxide (TaO), a hafnium oxide (HfO), a zirconium oxide (ZrO), a titanium oxide. (TiO), and the like. The compounds may be used alone or in combination with each other. In some cases, the gate insulating layer 130 may have a multi-layer structure including a plurality of insulating layers. For example, the insulating layers may have different thicknesses or may include different materials.

The gate electrode 140 may be disposed in the display area DA on the gate insulating layer 130. The gate electrode 140 may overlap the channel area of the active layer 120. For example, the gate electrode 140 may include a metal, an alloy, a metal nitride, a conductive metal oxide, a transparent conductive material, and the like. The compounds may be used alone or in combination with each other. In some cases, the gate electrode 140 may have a multi-layer structure including a plurality of metal layers. For example, the metal layers may have different thicknesses or may include different materials.

The interlayer insulating layer 150 may be disposed on the gate insulating layer 130 and the gate electrode 140. The interlayer insulating layer 150 may cover the gate electrode 140. The interlayer insulating layer 150 may include a silicon compound, a metal oxide, and the like. Examples of the silicon compound that may be used for the interlayer insulating layer 150 may include a silicon oxide (SiOx), a silicon nitride (SiNx), and the like. Additionally, examples of the metal oxide that may be used for the interlayer insulating layer 150 may include aluminum oxide (AlO), an aluminum nitride (AlN), a tantalum oxide (TaO), and the like. The compounds may be used alone or in combination with each other. In some cases, the interlayer insulating layer 150 may have a multi-layer structure including a plurality of insulating layers. For example, the insulating layers may have different thicknesses or may include different materials.

The source electrode 161 and the drain electrode 162 may be disposed in the display area DA on the interlayer insulating layer 150. The source electrode 161 may connect the source area of the active layer 120 through a first contact hole, and the drain electrode 162 may connect the drain area of the active layer 120 through a second contact hole. For example, each of the source electrode 161 and the drain electrode 162 may include a metal, an alloy, a metal nitride, a conductive metal oxide, a transparent conductive material, and the like. The compounds may be used alone or in combination with each other. In some cases, each of the source electrode 161 and the drain electrode 162 may have a multi-layer structure including a plurality of metal layers. For example, the metal layers may have different thicknesses or may include different materials.

The planarization layer 170 may be disposed on the interlayer insulating layer 150, the source electrode 161, and the drain electrode 162. The planarization layer 170 may cover the source electrode 161, and the drain electrode 162, sufficiently. The planarization layer 170 may include an organic material or an inorganic material. Examples of the organic material that may be used for the planarization layer 170 may include a photoresist, a polyacryl-based resin, a polyimide-based resin, a polyamide resin, a siloxane-based resin, an acryl-based resin, an epoxy-based resin, and the like. The compounds may be used alone or in combination with each other.

The lower electrode 190 may be disposed in the display area DA on the planarization layer 170. The lower electrode 190 of light-emitting element 300 may connect the drain electrode 162 of driving element 200 through a contact hole. In some cases, the lower electrode 190 may be an anode electrode. The lower electrode 190 may include a metal, an alloy, a metal nitride, a conductive metal oxide, a transparent conductive material, and the like. The compounds may be used alone or in combination with each other. In some cases, the lower electrode 190 may have a multi-layer structure including a plurality of metal layers. For example, the metal layers may have different thicknesses or may include different materials.

The pixel-defining layer 180 may be disposed in the display area DA on the planarization layer 170 and the lower electrode 190. The pixel-defining layer 180 may cover opposite sides of the lower electrode 190, and may expose a portion of an upper surface of the lower electrode 190. The pixel-defining layer 180 may include an organic material or an inorganic material. For example, the pixel-defining layer 180 may include at least one compounds selected from a group consisting of a polyimide, a polyamide, an acryl resin, a benzocyclobutene, and a phenol resin. In some cases, the pixel-defining layer 180 may include a black organic material. The pixel-defining layer 180 including the black organic material may be referred as black pixel defining-layer (BPDL). The BPDL may absorb the external light and may reduce reflectance of the display device 100.

The intermediate layer 210 of light-emitting element 300 may be disposed in the display area DA on the pixel-defining layer 180 and the lower electrode 190. The intermediate layer 210 may include a hole injection layer (HIL), a hole transporting layer (HTL), an organic emission layer (EML), an electron transporting layer (ETL), an electron injection layer (EIL), and the like. The organic emission layer may emit red, green, or blue light. In some cases, when the organic emission layer emits white light, the organic emission layer may include a multi-layer structure including a red organic emission layer, a green organic emission layer, and a blue organic emission layer. Alternatively, the organic emission layer may include a mixed layer of red, green, and blue light-emitting materials. For example, the organic emission layer may include a low molecular organic compound or a high molecular organic compound. The intermediate layer 210 may be referred to as the organic emission layer.

The upper electrode 220 may be disposed in the display area DA on the intermediate layer 210. The upper electrode 220 may include a metal, an alloy, a metal nitride, a conductive metal oxide, a transparent conductive material, and the like. The compounds may be used alone or in combination with each other. In some cases, the upper electrode 220 may have a multilayer structure including a plurality of metal layers. For example, the metal layers may have different thicknesses or include different materials. In some cases, the upper electrode 220 may be a cathode electrode.

The capping layer 230 may be disposed on the upper electrode 220. The capping layer 230 may be entirely disposed on the upper electrode 220, i.e., capping layer 230 may completely cover upper electrode 220. The capping layer 230 may serve to protect the upper electrode 220. For example, the capping layer 230 may include an organic material or an inorganic material.

The low reflection layer 240 may be disposed on the capping layer 230. In some cases, the low reflection layer 240 may be formed by depositing an inorganic material on the entire surface of the capping layer 230. In some cases, the low reflection layer 240 may be patterned to include a plurality of low reflection patterns spaced apart from each other. The low reflection layer 240 may induce destructive interference. Specifically, light reflected from the upper electrode 220 and light reflected from the low reflection layer 240 may disappear due to the interference. A phase difference between the light reflected from the upper electrode 220 and the light reflected from the low reflection layer 240 may be controlled by the thickness of the capping layer 230. As destructive interference is induced in the low reflection layer 240, the reflectance of external light may decrease.

The filler layer 500 may be disposed on the low reflection layer 240. Specifically, the filler layer 500 may be disposed on a portion of the display area DA and the peripheral area PA on the low reflection layer 240.

[Item 1]

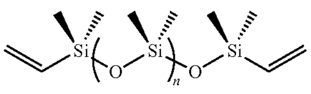

+

Monomer

-continued

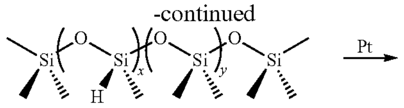

Linker

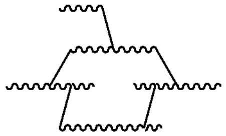

Crosslinked network

[Item 2]

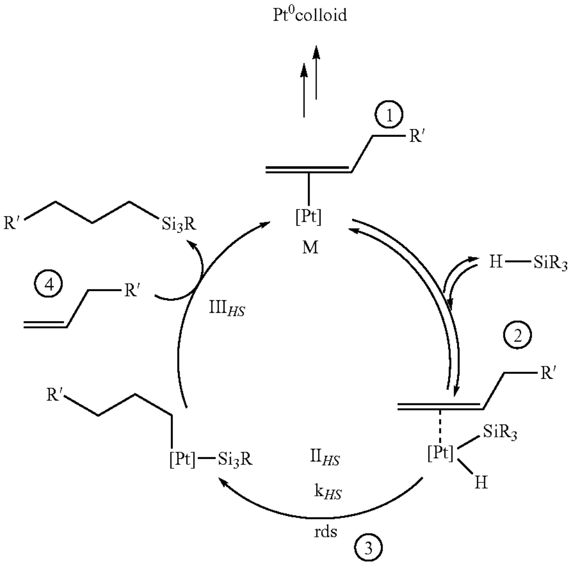

Item 1 describes a composition of the filler layer 500. Item 2 describes a curing mechanism (Chalk-Harrod mechanism) of the filler layer 500.

Referring to Items 1 and 2, the filler layer 500 may include a monomer, a linker, an initiator, and an inhibitor.

The monomer may include poly siloxane having a vinyl group. The monomers may be at least three. The monomer may have a viscosity of approximately 60,000 cp.

The linker may include a siloxane oligomer. The linker may have a viscosity of approximately 30 cp.

The filler layer 500 may include a third catalyst. The initiator may be the third catalyst. The third catalyst may promote a reaction in which the monomer and the linker react to form a Si—C bond. In some cases, the third catalyst may include platinum (Pt), rhodium (Rh), nickel (Ni), iron (Fe), and the like The third catalyst may form a coordination bond with the vinyl group of the monomer. Next, the Si-H bond of the linker may be oxidatively added to the third catalyst. Next, migratory insertion will occur from the bond between the third catalyst and hydrogen to an alkene coordinated with a metal (e.g., Pt in a Pt-H bond) included in the third catalyst. Finally, the Si-C bond may be formed by reductive elimination of the third catalyst. Accordingly, the filler layer 500 may be cured. Referring to Items 1 and 2, the third catalyst includes platinum (Pt), but the present invention is not necessarily limited thereto. For example, the third catalyst may include rhodium (Rh), nickel (Ni), iron (Fe), or the like.

In case of display device 100 including filler layer 500, interface reflectance of the display device 100 due to the external light may decrease due to decrease in refractive index difference. Therefore, the display device 100 including the filler layer 500 may have lower interface reflectance than a display device having an air gap structure (i.e., not including filler layer 500).

The reflection control layer 250 may be disposed on the filler layer 500. In such a case, the display device 100 might not include a polarizer. The reflection control layer 250 may include an organic material or the like. For example, the organic material may include a heat-curable resin, a UV-curable resin, and the like. The reflection control layer 250 may further include a pigment, dye, and the like. Thus, the reflection control layer 250 may increase a display quality of the display device 100 by absorbing light of a specific wavelength. For example, the reflection control layer 250 may absorb external light reflected from a lower portion of the reflection control layer 250. Additionally, the reflection control layer 250 may absorb light of a wavelength band other than light emitted to the outside among light emitted from the lower portion of the reflection control layer 250. The reflection control layer 250 may have a flat upper surface. Therefore, the reflection control layer 250 may undergo a planarization process. In some cases, the reflection control layer 250 may be patterned to include a plurality of reflection control patterns.

Figure 4:
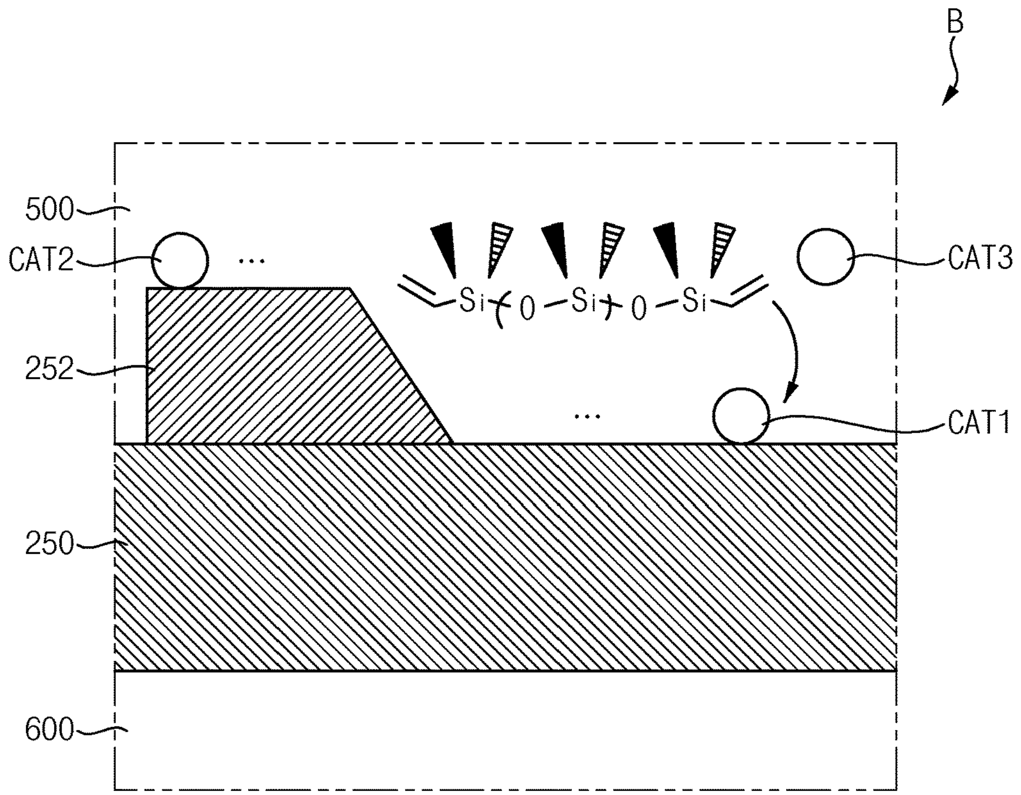
FIG. 4 is an enlarged cross-sectional view of area B of FIG. 3.

The reflection control layer 250 may include tetraazaporphyrin compounds, a photo-initiator, and a first catalyst (e.g., the first catalyst CAT1 of FIG. 4). In some cases, the first catalyst may include platinum (Pt), rhodium (Rh), nickel (Ni), iron (Fe), and the like. The first catalyst may bind to unshared electron pair included in a mixture comprising tetraazaporphyrin compounds and the photo-initiator. Additionally, the first catalyst may catalyze a curing reaction of the filler layer 500. For example, bonding between Si—H and vinyl groups may be promoted by the Chalk-Harrod mechanism of the filler layer 500.

In some cases, the first catalyst may include a same material as the third catalyst. In some cases, the first catalyst may include a material different from that of the third catalyst.

According to an embodiment, the first catalyst may be added in excess to the reflection control layer 250. Specifically, the mass ratio (%) of the first catalyst may be about 0.2% or greater than 0.2%. When the mass ratio of the first catalyst is less than 0.2%, un-curing of the filler layer 500 may occur in some regions.

According to an embodiment, the plurality of light-blocking patterns 252 may be disposed between the filler layer 500 and the reflection control layer 250. The plurality of light-blocking patterns 252 may absorb light to prevent color mixing. Since the reflection control layer 250 and the plurality of light-blocking patterns 252 absorb the external light, the reflectance of external light may decrease.

The plurality of light-blocking patterns 252 may include an organic black, a photo-initiator, and the second catalyst (e.g., the second catalyst CAT2 of FIG. 4). The second catalyst may bind to unshared electron pair included in a mixture including the organic black and the photo-initiator. In addition, the second catalyst may catalyze in the curing reaction of the filler layer 500. For example, the bonding between the Si—H and the vinyl groups may be promoted by the Chalk-Harrod mechanism of the filler layer 500.

According to an embodiment, the second catalyst may include platinum (Pt), rhodium (Rh), nickel (Ni), iron (Fe), and the like.

In some cases, the second catalyst may include the same material as the first catalyst. In some cases, the second catalyst may include the material different from that of the first catalyst.

In some cases, the second catalyst may include a same material as the third catalyst. In some cases, the second catalyst may include a material different from that of the third catalyst.

In some cases, the second catalyst may be excessively added to the plurality of light-blocking patterns 252. Thus, when the display device 100 includes the first catalyst and the second catalyst, a mass ratio (%) of the first catalyst and the second catalyst may be approximately 0.2% or greater than 0.2%. When the mass ratio of the first catalyst and the second catalyst is less than approximately 0.2%, un-curing may occur in some regions of the filler layer 500. Meanwhile, when the display device 100 includes the second catalyst, the mass ratio (%) of the second catalyst may be approximately 0.2% or greater than 0.2%. When the mass ratio of the second catalyst is less than approximately 0.2%, un-curing may occur in some regions of the filler layer 500.

A detailed description of the first catalyst, the second catalyst, and the third catalyst included in the reflection control layer 250, the plurality of light-blocking patterns 252, and the filler layer 500, respectively, will be described later with reference to FIGS. 4 and 5.

The encapsulation substrate 600 may be disposed on the reflection control layer 250. The encapsulation substrate 600 may prevent penetration of external moisture and oxygen. The encapsulation substrate 600 may include a transparent material or an opaque material. According to an embodiment, the encapsulation substrate 600 may include a quartz substrate, a synthetic quartz substrate, a calcium fluoride substrate, an F-doped quartz substrate, a soda lime glass substrate, or non-alkali glass substrate, and the like. The compounds may be used alone or in combination with each other.

The sealing member 610 may be disposed between the base substrate 110 and the encapsulation substrate 600. The sealing member 610 may be disposed in the peripheral area PA on the display panel 400. The sealing member 610 may be disposed along the edges of the base substrate 110 and the encapsulation substrate 600 in the peripheral area PA to surround the display area DA in a plan view. Additionally, the base substrate 110 and the encapsulation substrate 600 may be coupled through the sealing member 610. The sealing member 610 may include an organic material. For example, the sealing member 610 may include an epoxy resin or the like.

The display device 100 as described in the present disclosure is an organic light emitting display device, but the configuration of the present invention is not necessarily limited thereto. In some examples, the display device 100 may be a liquid crystal display device (LCD), a field emission display device (FED), a plasma display device (PDP), or an electrophoretic image display device (EPD) or the like.

Figure 5:
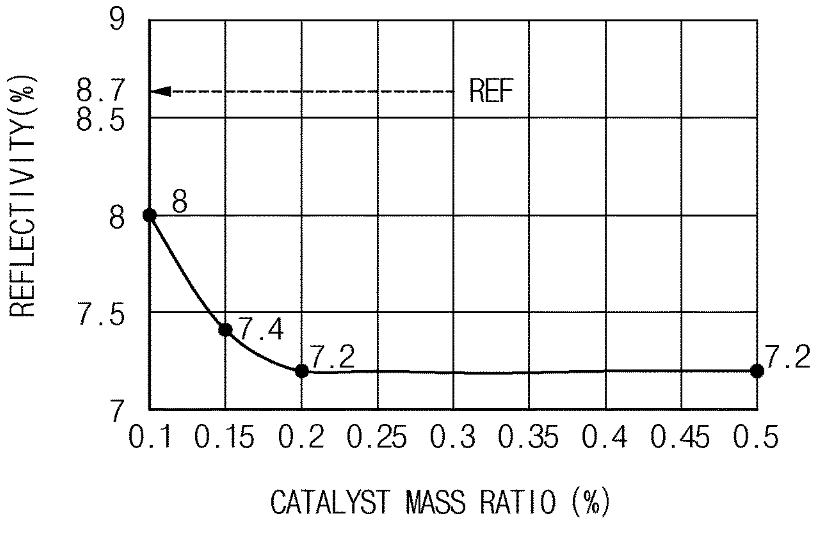
FIG. 5 is a graph showing a reflectance according to a catalyst mass ratio.

FIG. 4 is an enlarged cross-sectional view of area B of FIG. 3, and FIG. 5 is a graph for explaining a decrease in reflectance according to a catalyst mass ratio. For example, FIG. 4 shows an inversion of the area B of FIG. 3.

According to an embodiment of the present disclosure, the display device 100 may include the reflection control layer 250 including the first catalyst CAT1 and/or the plurality of light-blocking patterns 252 including the second catalyst CAT2. Accordingly, the reflectance of the display device 100 may be reduced.

Referring to FIGS. 4 and 5, the reflection control layer 250 including the first catalyst CAT1 may be disposed on the lower surface of the encapsulation substrate 600, the plurality of light-blocking patterns 252 including the second catalyst CAT2 may be disposed on the reflection control layer 250, and the filler layer 500 including the third catalyst may be disposed on the reflection control layer 250 and a plurality of light-blocking patterns.

Each of the first catalyst CAT1, the second catalyst CAT2, and the third catalyst may promote bonding between Si—H and vinyl groups by the curing mechanism (Chalk-Harrod mechanism) of the filler layer 500.

Here, the third catalyst may include the same material as the first catalyst CAT1. In some cases, the third catalyst may include a material different from that of the first catalyst CAT1. The third catalyst may include the same material as the second catalyst CAT2. In some cases, the third catalyst may include a material different from that of the second catalyst CAT2.

An embodiment of the present disclosure describes steps for the formation of a part of the display device 100. The reflection control layer 250 including the first catalyst CAT1 may be formed on the encapsulation substrate 600. The plurality of light-blocking patterns 252 including the second catalyst CAT2 may be formed on the reflection control layer 250. The filler layer 500 may be formed on the reflection control layer 250 and the plurality of light-blocking patterns 252.

First, the reflection control layer 250 including the first catalyst CAT1 may be formed on the encapsulation substrate 600.

According to an embodiment, the reflection control layer 250 may be formed by coating the encapsulation substrate 600 after adding the excessive amount of the first catalyst CAT1 to the mixture including tetraazaporphyrin compounds and the photo-initiator. When the mass ratio (%) of the first catalyst CAT1 is approximately 0.2% or greater than 0.2%, the additional catalyst (e.g., the first catalyst CAT1) included in the reflection control layer 250 may promote curing of the filler layer 500.

Next, the plurality of light-blocking patterns 252 including the second catalyst CAT2 may be formed on the reflection control layer 250.

According to an embodiment, the excessive amount of the second catalyst CAT2 may be added to the mixture including organic black and the photo-initiator. Next, the plurality of light-blocking patterns 252 may be formed through a patterning process.

According to an embodiment, the reflection control layer 250 may include the excessive amount of the first catalyst CAT1, and the plurality of light-blocking patterns 252 may include the excessive amount of the second catalyst CAT2. As shown in FIG. 5, when the mass ratio (%) of the catalysts (e.g., the first catalyst CAT1 and the second catalyst CAT2) is approximately 0.2% or greater than 0.2%, the additional catalysts (e.g., the first catalyst CAT1 and the second catalyst CAT2) included in the reflection control layer 250 and/or the plurality of light-blocking patterns 252 may promote curing of the filler layer 500.

Referring to FIG. 5, when the mass ratio (%) of the catalyst was approximately 0%, the reflectance of the display device 100 was approximately 8%. Additionally, when the mass ratio (%) of the catalyst was approximately 0.15%, the reflectance of the display device 100 was approximately 7.4%. Meanwhile, when the mass ratio (%) of the catalyst was approximately 0.2% or greater than 0.2%, the reflectance of the display device 100 was approximately 7.2%. Thus, when the mass ratio (%) of the catalyst is less than approximately 0.2%, some regions of the filler layer 500 might not be hardened and the reflectance may be higher than when the mass ratio (%) of the catalyst is about 0.2% or more. Therefore, the mass ratio (%) of the first catalyst CAT1 may be approximately 0.2% or greater than 0.2%.

For example, when the mass ratio of the first catalyst CAT1 is approximately 0.2% or more relative to the material capable of forming the reflection control layer 250, the plurality of light-blocking patterns 252 might not include the second catalyst CAT2. In some examples, the mass ratio of the first catalyst CAT1 and the second catalyst CAT2 may be approximately 0.2% or more relative to the material capable of forming the reflection control layer 250 and the plurality of light-blocking patterns 252.

In some cases, the second catalyst CAT2 may include the same material as the first catalyst CAT1. In some cases, the second catalyst CAT2 may include a material different from that of the first catalyst CAT1. For example, each of the first catalyst CAT1 and the second catalyst CAT2 may include platinum (Pt), rhodium (Rh), nickel (Ni), iron (Fe), or the like.

Next, the filler layer 500 may be formed on the reflection control layer 250 and the plurality of light-blocking patterns 252. The filler layer 500 may be cured after adding the third catalyst. The third catalyst may include platinum (Pt), rhodium (Rh), nickel (Ni), iron (Fe), or the like. Each of the first catalyst CAT1 included in the reflection control layer 250 and the second catalyst CAT2 included in the plurality of light-blocking patterns 252 may induce curing of the filler layer 500. Thus, each of the first catalyst CAT1 and the second catalyst CAT2 may promote the bonding reaction between the vinyl group of the monomer and the Si—H linker of the filler layer 500, thereby increasing the durability of the display device 100. In addition, the reflectance of the display device 100 by external light may be reduced. In addition, defects such as cracks or dark spots due to the un-curing of the filler layer 500 may be prevented in the display device 100.

According to an embodiment of the present disclosure, the display device 100 may include the additional catalyst (e.g., the first catalyst CAT1 and/or the second catalyst CAT2) including platinum (Pt), rhodium (Rh), nickel (Ni), iron (Fe), and the like. Accordingly, a curing degree of the filler layer 500 may be increased. Therefore, the durability of the display device 100 may be increased.

As shown in FIG. 5, when a display device does not include the filler layer 500 (i.e., when the low reflection layer 240 and the reflection control layer 250 have the air gap structure), the reflectance of the display panel was approximately 8.7%.

According to an embodiment of the present disclosure, when the filler layer 500 is included in the display device 100, the reflectance of the external light at the interface may be reduced due to a decrease in refractive index difference. Therefore, the reflectance of the display device 100 including the filler layer 500 may be smaller than that of the display device without the filler layer 500.

A portion of the first catalyst CAT1 may bind to unshared electron pair included in the mixture of the tetraazaporphyrin compounds and the photo-initiator. Additionally, a portion of the second catalyst CAT2 may bind to unshared electron pair included in the mixture of the organic black and the photo-initiator. The residual first catalyst CAT1 and/or the second catalyst CAT2 not bonded to the unshared electron pair may increase the degree of curing of the filler layer 500. Accordingly, the reflectance of the display device 100 may be lowered to approximately 7.2%. Thus, defects such as cracks or dark spots due to uncured filler layer 500 may be prevented. In addition, strength of the display device 100 may be increased by dispersing an external impact in the filler layer 500.

Figure 6:
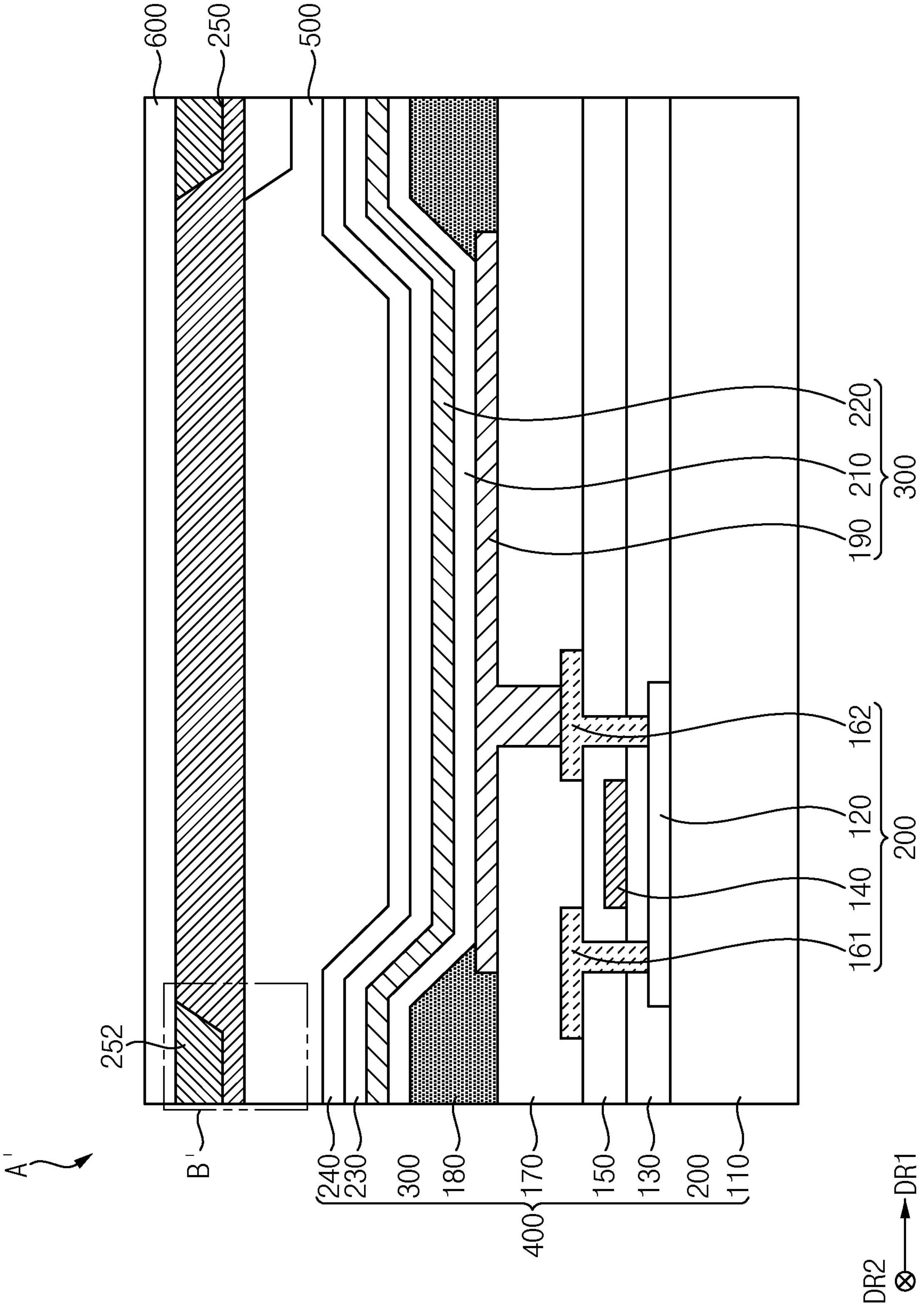
FIG. 6 is a cross-sectional view illustrating a display device according to another embodiment of the present disclosure.
Figure 7:
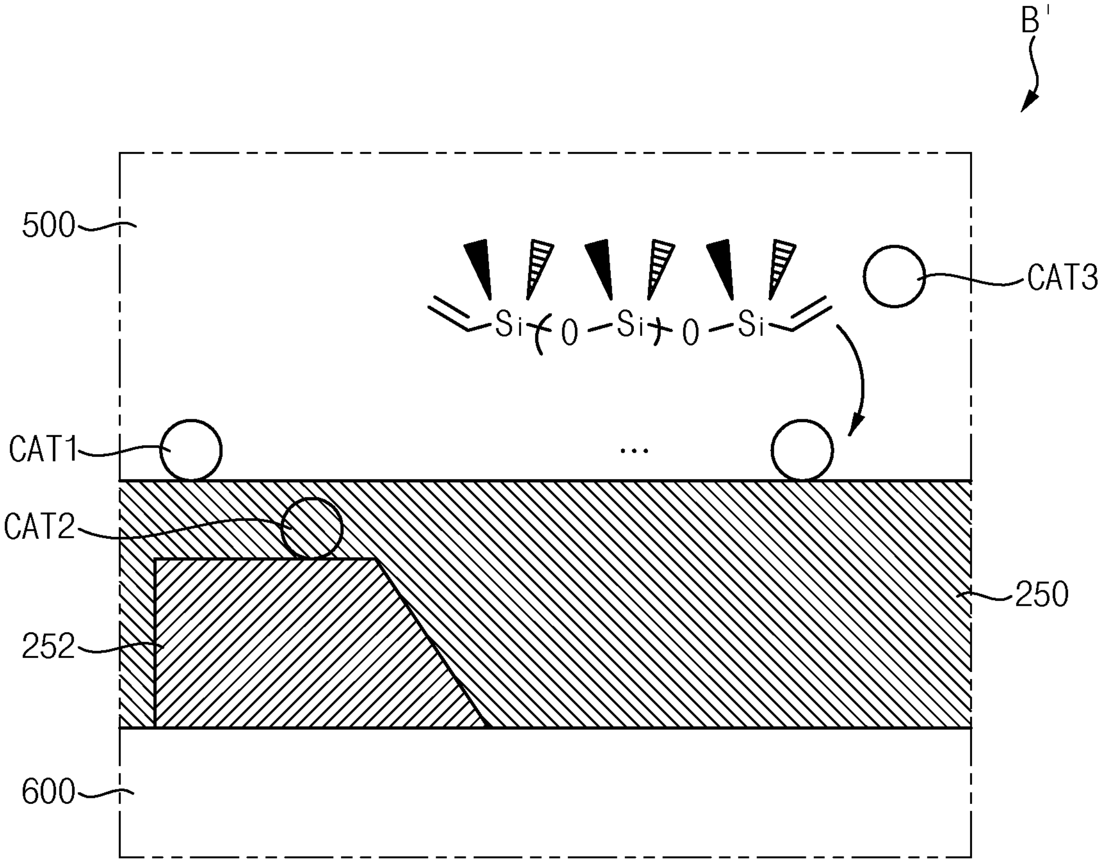
FIG. 7 is an enlarged cross-sectional view of area B' of FIG. 6.

FIG. 6 is a cross-sectional view illustrating a display device according to another embodiment of the present disclosure and FIG. 7 is an enlarged cross-sectional view of area B' of FIG. 6. For example, FIG. 7 may be an inverted view of area B' of FIG. 6.

Referring to FIGS. 6 and 7, the display device may include the display panel 400, the filler layer 500, the reflection control layer 250, the plurality of light-blocking patterns 252, the encapsulation substrate 600, and the sealing member 610. According to an embodiment of the present disclosure, the position of the plurality of light-blocking patterns 252 may be different from the display device 100 described with respect to FIGS. 3 and 4. Hereinafter, a detailed description of an element that is at least similar to a corresponding element of the display device 100 described with reference to FIGS. 1, 2, 3, 4, and 5 will be omitted or simplified.

Referring to FIG. 6, display panel 400 includes the light-emitting element 300 that may be disposed on the base substrate 110. As shown in FIG. 6 (and described with reference to FIG. 3), the light-emitting element 300 may include the lower electrode 190, the intermediate layer 210, and the upper electrode 220. The pixel-defining layer 180 may cover opposite sides of the lower electrode 190, and may expose the portion of the upper surface of the lower electrode 190. The pixel-defining layer 180 includes black organic that is capable of absorbing the external light. Accordingly, the reflectance of the display device due to the external light may be low.

The low reflection layer 240 may be included in the display panel 400. Light reflected from the upper electrode 220 and light reflected from the low reflection layer 240 may disappear due to the interference. The low reflection layer 240 may induce the destructive interference between the light reflected from the upper electrode 220 and the light reflected from the low reflection layer 240, and may decrease the reflectance due to the external light.

The encapsulation substrate 600 may be disposed on reflection control layer 250 and is spaced apart from the display panel 400. In this case, the sealing member 610 may be disposed between the base substrate 110 and the encapsulation substrate 600 (as described with reference to FIGS. 3 and 4).

According to an embodiment, the reflection control layer 250 may include tetraazaporphyrin compounds, the photo-initiator, and the first catalyst CAT1. In some cases, the first catalyst CAT1 may include platinum (Pt), rhodium (Rh), nickel (Ni), iron (Fe), and the like. The first catalyst CAT1 may bind to the unshared electron pair included in the mixture comprising the tetraazaporphyrin compounds and the photo-initiator. The first catalyst CAT1 may catalyze the curing reaction of the filler layer 500. Thus, a portion of the first catalyst CAT1 may bind to unshared electron pair included in the mixture of the tetraazaporphyrin compounds and the photo-initiator and the residual first catalyst CAT1 not bonded to the unshared electron pair may increase the degree of curing of the filler layer 500.

According to an embodiment, the first catalyst CAT1 may be added to the reflection control layer 250 in excess. Specifically, the mass ratio (%) of the first catalyst CAT1 may be approximately 0.2% or greater than 0.2%. When the mass ratio of the first catalyst CAT1 is less than 0.2%, un-curing may occur in some regions of the filler layer 500.

According to an embodiment, the plurality of light-blocking patterns 252 may be disposed between the reflection control layer 250 and the encapsulation substrate 600.

The plurality of light-blocking patterns 252 may include an organic black, a photo-initiator, and the second catalyst CAT2. The second catalyst CAT2 may bind to unshared electron pair included in the mixture comprising the organic black and the photo-initiator. In addition, the second catalyst CAT2 may catalyze in the curing reaction of the filler layer 500. Therefore, a portion of the second catalyst CAT2 may bind to unshared electron pair included in the mixture of the organic black and the photo-initiator and the residual second catalyst CAT2 not bonded to the unshared electron pair may increase the degree of curing of the filler layer 500.

Each of the first catalyst CAT1 and the second catalyst CAT2 may catalyze the curing reaction of the filler layer 500. Accordingly, the first catalyst CAT1 and the second catalyst CAT2 may induce the curing degree of the filler layer 500. In some cases, the second catalyst CAT2 may include the same material as the first catalyst CAT1. In some cases, the second catalyst CAT2 may include a material different from the material of the first catalyst CAT1.

In some cases, the second catalyst CAT2 might not be included. Thus, the plurality of light-blocking patterns 252 may include the organic black and the photo-initiator.

According to an embodiment, each of the mass ratios (%) of the first catalyst CAT1 and the second catalyst CAT2 may be approximately 0.2% or greater than 0.2%. When the mass ratio of the first catalyst CAT1 and the second catalyst CAT2 is less than 0.2%, un-curing may occur in some regions of the filler layer 500. In some cases, when the display device includes the second catalyst CAT2, the mass ratio (%) of the second catalyst CAT2 may be approximately 0.2% or greater than 0.2%. In some cases, when the display device includes the first catalyst CAT1, the mass ratio (%) of the first catalyst CAT1 may be approximately 0.2% or greater than 0.2%. In some cases, when the mass ratio of the second catalyst CAT2 or the first catalyst CAT1 is less than approximately 0.2%, un-curing may occur in some regions of the filler layer 500.

The filler layer 500 may be disposed between the low reflection layer 240 and the reflection control layer 250. The filler layer 500 may include the third catalyst CAT3 for curing.

According to an embodiment, the third catalyst CAT3 included in the filler layer 500 and the first catalyst CAT1 included in the reflection control layer 250 may include a same material. In some cases, the third catalyst CAT3 included in the filler layer 500 and the first catalyst CAT1 included in the reflection control layer 250 may include a different material.

According to an embodiment, when the plurality of light-blocking patterns 252 includes the second catalyst CAT2, the third catalyst CAT3 included in the reflection control layer 250 may include the same material. In some cases, the second catalyst CAT2 included in the plurality of light-blocking patterns 252 and the third catalyst CAT3 included in the filler layer 500 may include the same material.

In some examples, the third catalyst CAT3 may include platinum (Pt), rhodium (Rh), nickel (Ni), iron (Fe), or the like. The third catalyst CAT3 including platinum (Pt), rhodium (Rh), nickel (Ni), iron (Fe), and the like may promote the bonding reaction between the vinyl group of the monomer and the Si—H of the linker.

In some cases, the first catalyst CAT1 may include the same material as the third catalyst CAT3. In some cases, the first catalyst CAT1 may include a material different from that of the third catalyst CAT3.

In some cases, the second catalyst CAT2 may include the same material as the third catalyst CAT3. In some cases, the second catalyst CAT2 may include the material different from that of the third catalyst CAT3.

According to embodiments of the present disclosure, the display device may be formed by adding the excessive amount of the first catalyst CAT1 to the reflection control layer 250 or the excessive amount of the second catalyst CAT2 to the plurality of light-blocking patterns 252. Thus, un-curing of the filler layer 500 can be reduced or prevented. The excess portion of the first catalyst CAT1 and/or the second catalyst CAT2 may bind to unshared electron pair included in the mixture of the tetraazaporphyrin compounds and the photo-initiator and unshared electron pair included in the mixture of the organic black and the photo-initiator. The residual first catalyst CAT1 and/or the second catalyst CAT2 not bonded to the unshared electron pair may induce increase in the curing degree of the filler layer 500. Accordingly, reflectance of the display device may be reduced and defects such as cracks or dark spots due to uncured filler layer 500 may be prevented. Additionally, strength of the display device may be increased by dispersing the external impact in the filler layer 500.

Accordingly, embodiments of the present disclosure include a display device comprising a display panel, a filler layer, a reflection control layer, a plurality of light-blocking patterns, and an encapsulation substrate. The reflection control layer comprises a first catalyst and a plurality of light-blocking patterns comprises a second catalyst which ensures curing of the filler layer to enhance the display quality of the display device.

Although the methods and the systems according to the embodiments have been described with reference to the drawings, the illustrated embodiments are examples and may be modified and changed by a person having ordinary knowledge in the relevant technical field without departing from the technical spirit described in the following claims.

The present disclosure may be applied to the display apparatus including the display device. For example, the present disclosure may be applied to high-resolution smartphones, mobile phones, smart pads, smart watches, tablet PCs, vehicle navigation systems, televisions, computer monitors, laptops, and the like.

What is claimed is:

1. A display device comprising:

a display panel including a light-emitting element disposed on a base substrate;

a filler layer disposed on the display panel;

a reflection control layer including a first catalyst and disposed on the filler layer, wherein the first catalyst includes at least one of platinum, rhodium, nickel, and iron;

a plurality of light-blocking patterns disposed between the filler layer and the reflection control layer; and an encapsulation substrate disposed on the reflection control layer.

2. The display device of claim 1, wherein a mass ratio of the first catalyst is greater or equal to 0.2%.

3. The display device of claim 1, wherein the reflection control layer includes a tetraazaporphyrin compound and a photo-initiator.

4. The display device of claim 1, wherein each of the plurality of light-blocking patterns includes organic black and a photo-initiator.

5. The display device of claim 1, wherein each of the plurality of light-blocking patterns includes a second catalyst, and wherein the second catalyst includes at least one of platinum, rhodium, nickel, and iron.

6. The display device of claim 5, wherein the second catalyst includes a same material as the first catalyst.

7. The display device of claim 1, wherein the filler layer includes a third catalyst, and wherein the third catalyst includes at least one of platinum, rhodium, nickel, and iron.

8. The display device of claim 7, wherein the third catalyst includes a same material as the first catalyst.

9. The display device of claim 1, wherein the light-emitting element includes:

a lower electrode;

a pixel-defining layer covering opposite sides of the lower electrode and including a black organic material, wherein the pixel-defining layer exposes a portion of an upper surface of the lower electrode;

an intermediate layer disposed on the pixel-defining layer and the lower electrode; and an upper electrode disposed on the intermediate layer.

10. The display device of claim 1, further comprising:

a sealing member sealing the base substrate and the encapsulation substrate between the base substrate and the encapsulation substrate.

11. A display device comprising:

a display panel including a light-emitting element disposed on a base substrate;

a filler layer disposed on the display panel;

a reflection control layer, including a first catalyst, disposed on the filler layer, wherein a mass ratio of the first catalyst is greater or equal to 0.2%;

an encapsulation substrate disposed on the reflection control layer; and a plurality of light-blocking patterns disposed between the reflection control layer and the encapsulation substrate.

12. The display device of claim 11, wherein the first catalyst includes at least one of platinum, rhodium, nickel, and iron.

13. The display device of claim 11, wherein the reflection control layer includes a tetraazaporphyrin compound and a photo-initiator.

14. The display device of claim 11, wherein each of the plurality of light-blocking patterns includes organic black and a photo-initiator.

15. The display device of claim 11, wherein each of the plurality of light-blocking patterns includes a second catalyst, and wherein the second catalyst includes at least one of platinum, rhodium, nickel, and iron.

16. The display device of claim 15, wherein the second catalyst includes a same material as the first catalyst.

17. The display device of claim 11, wherein the light-emitting element includes:

a lower electrode;

a pixel-defining layer covering opposite sides of the lower electrode and including a black organic material, wherein the pixel-defining layer exposes a portion of an upper surface of the lower electrode;

an intermediate layer disposed on the pixel-defining layer and the lower electrode; and an upper electrode disposed on the intermediate layer.

18. The display device of claim 11, further comprising:

a sealing member sealing the base substrate and the encapsulation substrate between the base substrate and the encapsulation substrate.

19. A display device comprising:

a display panel including a light-emitting element disposed on a base substrate;

a filler layer disposed on the display panel;

a reflection control layer, including a first catalyst, disposed on the filler layer, wherein the reflection control layer includes a tetraazaporphyrin compound and a photo-initiator;

an encapsulation substrate disposed on the reflection control layer; and a plurality of light-blocking patterns disposed between the reflection control layer and the encapsulation substrate.

* * * * *